US005859566A

United States Patent [19]

Voorman et al.

[11] Patent Number: 5,859,566

[45] Date of Patent: Jan. 12, 1999

[54] ELECTRONIC CIRCUIT COMPRISING COMPLEMENTARY TRANSCONDUCTORS FOR FILTERS AND OSCILLATORS

[75] Inventors: Johannes O. Voorman; Hugo Veenstra, both of Eindhoven, Netherlands

[73] Assignee: U.S. Philips Corporation, New York, N.Y.

[21] Appl. No.: 891,821

[22] Filed: Jul. 14, 1997

[30] Foreign Application Priority Data

Jul. 24, 1996 [EP] European Pat. Off. .............. 96202091

[51] Int. Cl.[6] .............. H03F 3/45

[52] U.S. Cl. .............. 330/252; 330/258

[58] Field of Search .............. 330/258, 252, 330/257, 295

[56] References Cited

U.S. PATENT DOCUMENTS

| | | | |
|---|---|---|---|
| 3,870,966 | 3/1975 | Dingwall | 330/253 |
| 3,991,380 | 11/1976 | Pryor | 330/258 |
| 4,766,394 | 8/1988 | Yukawa | 330/257 |
| 5,412,343 | 5/1995 | Rijns | 330/258 |
| 5,631,607 | 5/1997 | Huijsing et al. | 330/258 |

FOREIGN PATENT DOCUMENTS

| | | | |
|---|---|---|---|
| 0210147 | 5/1984 | German Dem. Rep. | 330/257 |
| 0 003 156 | 1/1990 | Japan | 330/252 |

OTHER PUBLICATIONS

"Integrated Continuous–Time Filters", Principle, Design, and Applications, Edited by Y.P. Tsividis and J.O. Voorman, IEEE Press, New York, Paper 3–B.4.

"A Micropower CMOS Continuous–Time Low–Pass Filter", IEEE Journal of Solid–State Circuits, vol. 24, No. 3, Jun. 1989, pp. 736–743.

*Primary Examiner*—Robert Pascal
*Assistant Examiner*—Khanh Van Nguyen
*Attorney, Agent, or Firm*—Steven R. Biren

[57] ABSTRACT

An electronic circuit comprises coupled transconductors (TR1 and TR2). The transconductors comprise two complementary differential pairs whose outputs are connected directly to two output terminals. Two diodes (P3, N3) are arranged in series between the common terminals of the differential pairs. The common-mode voltage of the differential pairs is available on the node between the two diodes. The common-mode voltage of the one transconductor (TR2) is used to control one of the bias current sources of the other transconductor (TR1) and, if desired, also that of the one transconductor (TR2). In this way the common-mode voltage on the output terminals of the other transconductor (TR1) is fixed.

13 Claims, 7 Drawing Sheets

TR1
TR2
TR3
TR4
TR5
C1
C2
C3
FIA
FIB
Vi
FOA
FOB
Vo
P8(2)
P9
P10
P11
P12
P13
P14
P15
P16
BA
IA
IB
CM
OA
OB
G
2G

P20(2)
P21
P22
P23
P24
P25
P26
P27
P28
P29
P30
P31
P32
TR1
TR2
TR3
TR4
TR5
TR6
TR7
C1
C2
C3
C4
C5
C6
C7
FIA
Vi
FIB
FOA
Vo
FOB
BA
CM
IA
IB
OA
OB
G
2G

ELECTRONIC CIRCUIT COMPRISING COMPLEMENTARY TRANSCONDUCTORS FOR FILTERS AND OSCILLATORS

BACKGROUND OF THE INVENTION

1. Field of the Invention

The invention relates to an electronic circuit comprising a plurality of at least a first transconductor and a second transconductor, each having first and second input terminals for receiving a differential voltage and having first and second output terminals for supplying a differential current in response to the differential voltage.

2. Description of the Related Art

Such an electronic circuit is known from "A Micropower CMOS Continuous-Time Low-Pas filter", IEEE Journal of Solid-State Circuits, Vol. 24, No. 3, June 1989, pp. 736–743. Transconductors are voltage-controlled current sources used in so-termed Transconductor-C filters, also referred to as Balanced Integrator Filters, because the electronic circuits are generally constructed as balanced devices. The background technique for filters of this type is described comprehensively in the book "Integrated Continuous-Time Filters", edited by Y. P. Tsividis and J. O. Voornan, IEEE Press, New York, in which book said IEEE-article appears as Paper 3-B.4. The simplest transconductor is the differential transistor pair. The operational transconductance amplifier (OTA) can be regarded as a complex transconductor. Transconductor-C filters are often integrated, the aim then being, on the one hand, to use a minimal chip area and, on the other hand, to provide a high-quality filter. Said book discloses many variants and improvements based on the differential pair, with the purpose of improving certain characteristics such as linearity, bandwidth and output voltage swing. This means that there is a need for compact transconductors, i.e. occupying a small chip area, which are suitable for use in transconductor-C filters.

SUMMARY OF THE INVENTION

In order to achieve this, according to the invention, the electronic circuit of the type defined in the opening paragraph is characterized in that each transconductor of the at least first transconductor and second transconductor comprises:

- a first differential pair of transistors of a first conductivity type, having their respective first main electrodes coupled to one another in a first node, having their respective second main electrodes coupled to the first output terminal and the second output terminal, and having their respective control electrodes coupled to the first input terminal and the second input terminal;
- a second differential pair of transistors of a second conductivity type opposite to the first conductivity type of the first differential pair, the second differential pair having their respective first main electrodes coupled to one another in a second node, having their respective second main electrodes coupled to the first output terminal and the second output terminal, and having their respective control electrodes coupled to the first input terminal and the second input terminal;
- a first current source coupled to the first node to supply a first bias current to the first differential pair;
- a second current source coupled to the second node to supply a second bias current to the second differential pair;
- a first diode-connected transistor of the first conductivity type and a second diode-connected transistor of the second conductivity type, which are connected in series between the first node and the second node;

and the electronic circuit further comprises:

- means for controlling the first current source of at least the first transconductor in response to a common-mode voltage of the second transconductor.

The transconductors each comprise two complementary transistor pairs which, depending on the transistor type, have their bases or gates connected to the input terminals and their collectors or drains connected to the output terminals. The emitter or source nodes of each pair are coupled to a bias current source. Two diode-connected transistors, i.e. transistors whose base is connected to the collector or whose gate is connected to the drain, are arranged in series between the respective nodes of the two pairs. A transconductor of this type is known per se from U.S. Pat. No. 3,991,380. The bias currents in the transistors of the complementary transistor pairs should be exactly equal to one another. Possible differences can only find their way via the load, provided that this load allows the passage of direct current. If this is not the case, the direct voltages on the output terminals will drift to an indeterminate value and will disturb the operation of the other transconductors coupled to the output terminals. This can be precluded by providing a special load circuit having a low common-mode gain and a high differential gain. This requires additional resistors and/or transistors, which are often undesirable in view of the filter design or which occupy additional chip area. In said U.S. Pat. No. 3,991,380 this problem is solved by measuring the common-mode voltage on the output terminals to control the current of the bias current sources of the two complementary transistor pairs. For each individual transconductor this requires a number of additional transistors and, consequently, additional chip area. However, taking steps to mitigate common-mode problems for each individual transconductor may lead to instabilities when such transconductors are used in circuits with cross-coupled transconductors, as is the case in, for example, gyrator circuits.

In transconductor-C filters the outputs of the one transconductor are coupled to the inputs of another transconductor. According to the invention, no separate steps are taken within each individual transconductor in order to influence the common-mode voltage on the output terminals of this transconductor, as disclosed in said U.S. Pat. No. 3,991,380, but such steps are applied to groups. The common-mode voltage of one transconductor is then used to control one of the two bias current sources of one or more other transconductors and, if desired, also of this one transconductor. This saves many components and precludes instabilities, particularly in complex filter arrangements.

It is to be noted that in said IEEE article the common-mode voltage of a first transconductor is used to influence the common-mode voltage of a second transconductor. This is effected only between each time two transconductors and not in groups. Moreover, the transconductors in said IEEE article are of an entirely different type, in which not the bias current source of one of the two input differential pairs is controlled.

In principle, one of the two bias current sources of the one transconductor can be controlled in response to the common-mode voltage in various manners. A compact circuit for this purpose is characterized in that the means for controlling comprise:

- a measurement transistor of the first conductivity type having a control electrode connected to a node between the first diode-connected transistor and the second diode-connected transistor of the second transconductor; and a current mirror having an input branch coupled to the first main electrode of the measurement transistor, and having output branches coupled to respective first nodes of at least the first transconductor and the second transconductor, and in particular in that the input branch of the current mirror comprises:

a measurement transistor of the first conductivity type having a control electrode connected to a node between the first diode-connected transistor and the second diode-connected transistor of the second transconductor;

a further diode-connected transistor of the first conductivity type arranged in series with the first main electrode of the measurement transistor; and a still further transistor of the first conductivity type having a control electrode and a first main electrode arranged in parallel with corresponding electrodes of the further diode-connected transistor and having a second main electrode coupled to the first node of the second transconductor.

The common-mode voltage of the second transconductor appears on the node between the two diode-connected transistors. The measurement transistor feeds this voltage back to the input branch of the current mirror. The current through the input branch is mirrored to the first nodes, i.e. one of the two emitter or source nodes, of the group of transconductors.

Further components can be saved in complex transconductor-C filters by interconnecting the respective nodes of the diode-connected transistors of a plurality of transconductors, particularly of transconductors whose input terminals are connected to one another.

By means of two transconductors and two capacitors it is also possible to form an oscillator by connecting the outputs of the one transconductor to the inputs of the other transconductor and vice versa. An embodiment which is suitable for such a configuration is characterized in that the first and the second transconductor each further comprise:

a further differential pair of transistors of the first conductivity type, having respective first main electrodes coupled to one another in a further node, having respective second main electrodes coupled to the first input terminal and the second input terminal, and having respective control electrodes coupled to the second input terminal and the first input terminal; and a current mirror having an input branch coupled to the further node of the first transconductor and having an output branch coupled to the first node of the second transconductor.

The further differential pair provides attenuation equalization for small signals, so that the oscillator starts correctly, and also functions as the supplier of the common-mode voltage of the relevant transconductor.

This embodiment may be characterized in that further in that the first and the second transconductor each further comprise:

a third current source for supplying a third bias current;

a third diode-connected transistor of the second conductivity type, connected between the first input terminal and the third current source;

a fourth diode-connected transistor of the second conductivity type, connected between the second input terminal and the third current source;

a fourth current source for supplying a fourth bias current;

a fifth diode-connected transistor of the second conductivity type, connected between the first input terminal and the fourth current source; and a sixth diode-connected transistor of the second conductivity type, connected between the second input terminal and the fourth current source.

The third through sixth diode-connected transistors and the third and the fourth current source provide large-signal attenuation so as to limit the amplitude of the oscillation signal.

BRIEF DESCRIPTION OF THE DRAWINGS

These and other aspects of the invention will be described and elucidated with reference to the accompanying drawings, in which.

In these Figures parts having the same function or purpose bear the same reference symbols.

DESCRIPTION OF THE PREFERRED EMBODIMENTS

Figure 1:
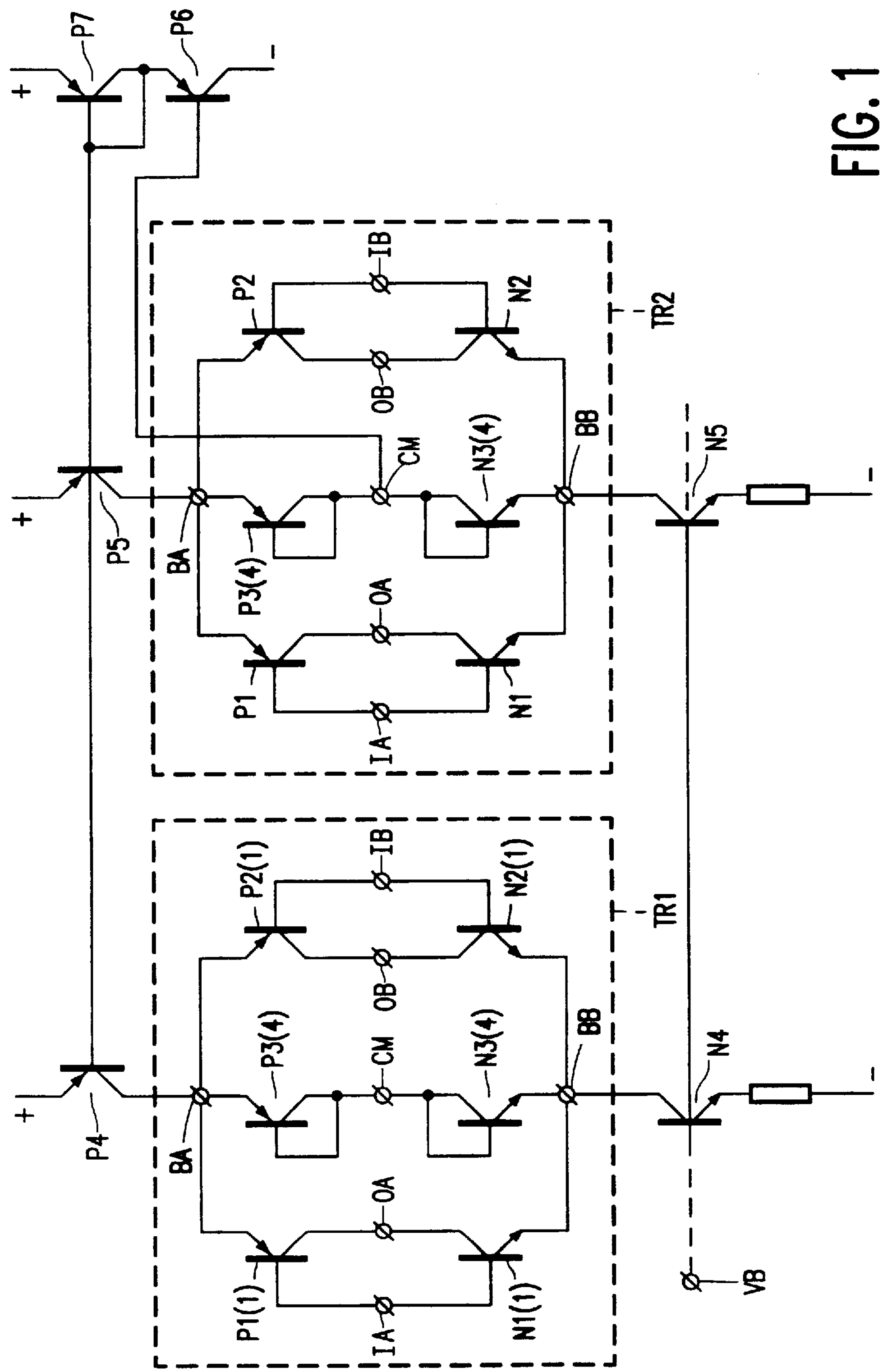
FIG. 1 shows an embodiment of an electronic circuit with transconductors in accordance with the invention.

FIG. 1 shows an embodiment of an electronic circuit with transconductors in accordance with the invention. The circuit comprises two transconductors TR1 and TR2. Each of the transconductors has input terminals IA and IB for receiving a differential input voltage, output terminals OA and OB for supplying a differential output current, a first node BA for receiving a first bias current, a second node BB for receiving a second bias current, and a common-mode terminal CM for supplying a common-mode voltage. Each of the transconductors further comprises: a PNP transistor pair comprising transistors P1 and P2 having their first main electrodes or emitters coupled to the first node BA, having their control electrodes or bases coupled to the input terminal IA and the input terminal IB, respectively, and having their second main electrodes or collectors coupled to the input terminal OA and the output terminal OB, respectively; an NPN transistor pair comprising transistors N1 and N2 having their emitters coupled to the second node BB, having their bases coupled to the input terminal IA and the input terminal IB, respectively, and having their collectors coupled to the output terminal OA and the output terminal OB, respectively; as well as a diode-connected PNP transistor P3 between the first node BA and the common-mode terminal CM, and a second diode-connected NPN transistor between the common-mode terminal CM and the second node BB. The emitter area of the transistor P3 is preferably 4 times as large as the emitter area of the transistors P1 and P2, as is indicated by the parenthesized figures. The same applies to the emitter area of the transistor N3, which is preferably chosen to be four times as large as that of the transistors N1 and N2.

The NPN transistor pair N1, N2 of the transconductor TR1 receives bias current from an NPN current source transistor N4, which is connected between the second node BB and the negative supply voltage. An NPN transistor N5 performs the same function for the other transconductor TR2. The bases of the current source transistors N4 and N5 are connected to a voltage source VB, by means of which the bias currents of the transistors N4 and N5 are fixed.

The PNP transistor pair P1, P2 of the transconductor TR1 receives bias current from a PNP current source transistor P4, which is connected between the first node BA and the positive supply voltage. A similarly arranged PNP transistor P5 supplies bias current to the first node BA of the transconductor TR2. The common-mode terminal CM of the transconductor TR2 is coupled to a diode-connected PNP transistor P7 via the base-emitter junction of a PNP transistor P6 arranged as an emitter-follower, the transistor P7 having its base-emitter junction arranged in parallel with that of the transistors P4 and P5. The transistors P4 and P5/P6/P7 together form a simple current mirror having an input branch, i.e. the transistors P5/P6/P7, and an output branch, i.e. the transistor P4.

Figure 2:
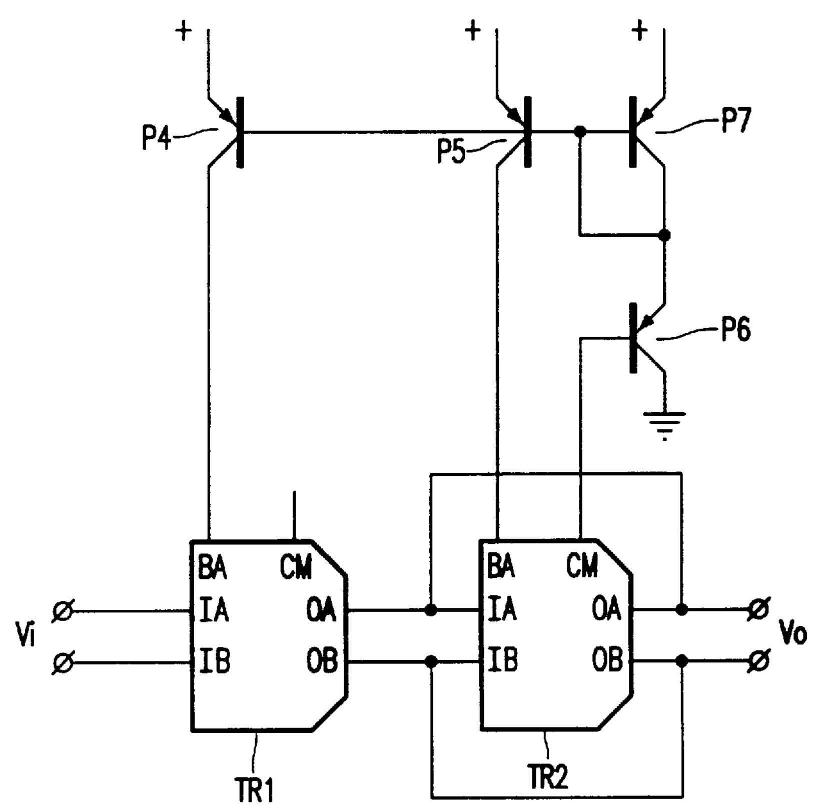
FIG. 2 shows the embodiment of FIG. 1, the transconductors being shown as symbols.

The input terminals and the output terminals of the transconductors TR1 and TR2 are coupled to one another as shown in FIG. 2, in which each transconductor is represented as a symbol with indications of the input terminals IA and IB, the output terminals OA and OB, the common-mode terminal CM and the first node BA. The biasing of the respective nodes BA of the transconductors with the transistors P4, P5, P6 and P7 is shown explicitly. The biasing of the respective nodes BB with the current source transistors N4 and N5 is not shown. The output terminals OA and OB of the transconductor TR1 are interconnected to the input terminals IA and IB of the transconductor TR2. The output terminals OA and OB of the transconductor TR2 are interconnected to the input terminals IA and IB, as a result of which the transconductor TR2 functions as a resistor which loads the transconductor TR1.

The quiescent current through the transistor P1 also flows through the transistor N1. The same applies to the quiescent current through the transistors P2 and N2. If the nodes BA and BB were both energized with current sources having a fixed current intensity a problem would arise if these current sources do not supply equal currents and/or if the transistors P1/N1 and the transistors P2/N2 are not equally conductive for the same base voltage. As a result of this, the common-mode voltage component of the voltage between the output terminals OA and OB of the transconductor TR1 is indeterminate and, as a consequence, the transconductor TR2 coupled to the output terminals of the transconductor TR1 can end up in an undesirable DC operating range.

This is precluded by controlling the current of one of the current sources for energizing the nodes BA and BB. By way of example, the choice has been made to control the current to the node BA and to fix the current to the node BB, as is shown in FIG. 1. The common-mode voltage of the transconductor TR2 is measured on the common-mode terminal CM of the transconductor TR2 by means of the emitter-follower P6 and is fed back to the base of the transistor P5, which thus forms the input branch of the current mirror constituted by the transistors P5 and P4. Both transconductors now receive a current on their respective nodes BA, which current is dependent upon the common-mode voltage on the common-mode terminal CM of the transconductor TR2. This common-mode voltage is equal to the positive supply voltage minus two diode voltages.

An increase of the common-mode voltage on the output terminals OA and OB of the transconductor TR1 results in an increase of the common-mode voltage on the input terminals IA and IB of the other transconductor TR2. Therefore, the voltage on the nodes BA and BB and hence on the common-mode terminal CM of the transconductor TR2 will also increase. As a result, the transistor P6 becomes less conductive and the node BA of the transconductor TR1 will receive less current from the current source transistor P4, thereby counteracting the initial increase of the common-mode voltage of the transconductor TR1. Thus, the common-mode voltage of the transconductor TR2 is fixed and the associated quiescent current through the node BA is copied to the node BA of the transconductor TR1 by means of the current mirror.

The common-mode voltage can also be fed back to the common-mode terminal CM of the transconductor TR2 to the base of the transistor P5 in another manner than shown in FIG. 1. The transistor P6 can alternatively be a diode-connected transistor having its emitter connected to the base of the transistor P5, in which case the transistor P7 is dispensed with. This again results in a constant voltage difference between the base and the collector of the transistor P5, which transistor then again functions as the input branch of the current mirror.

The use of the diode-connected transistor P7 reduces the settling time of the common-mode control. The d.c. level on the input terminals IA and IB of the transconductor TR1 can be chosen freely. The transconductors are of a simple structure and can be used up to signal frequencies of a few hundreds of MHz.

Instead of the bipolar transistors shown, it is possible to use unipolar (MOS) transistors, in which case base, emitter and collector should read gate, source and drain, respectively, and a diode-connected transistor is formed by interconnecting the gate and the drain. If desired, the transistors chosen for the current source transistors may be of another type than the transistors in the transconductors, for example MOS transistors in the current source transistors and bipolar transistors in the transconductors or the other way round.

Figure 3:
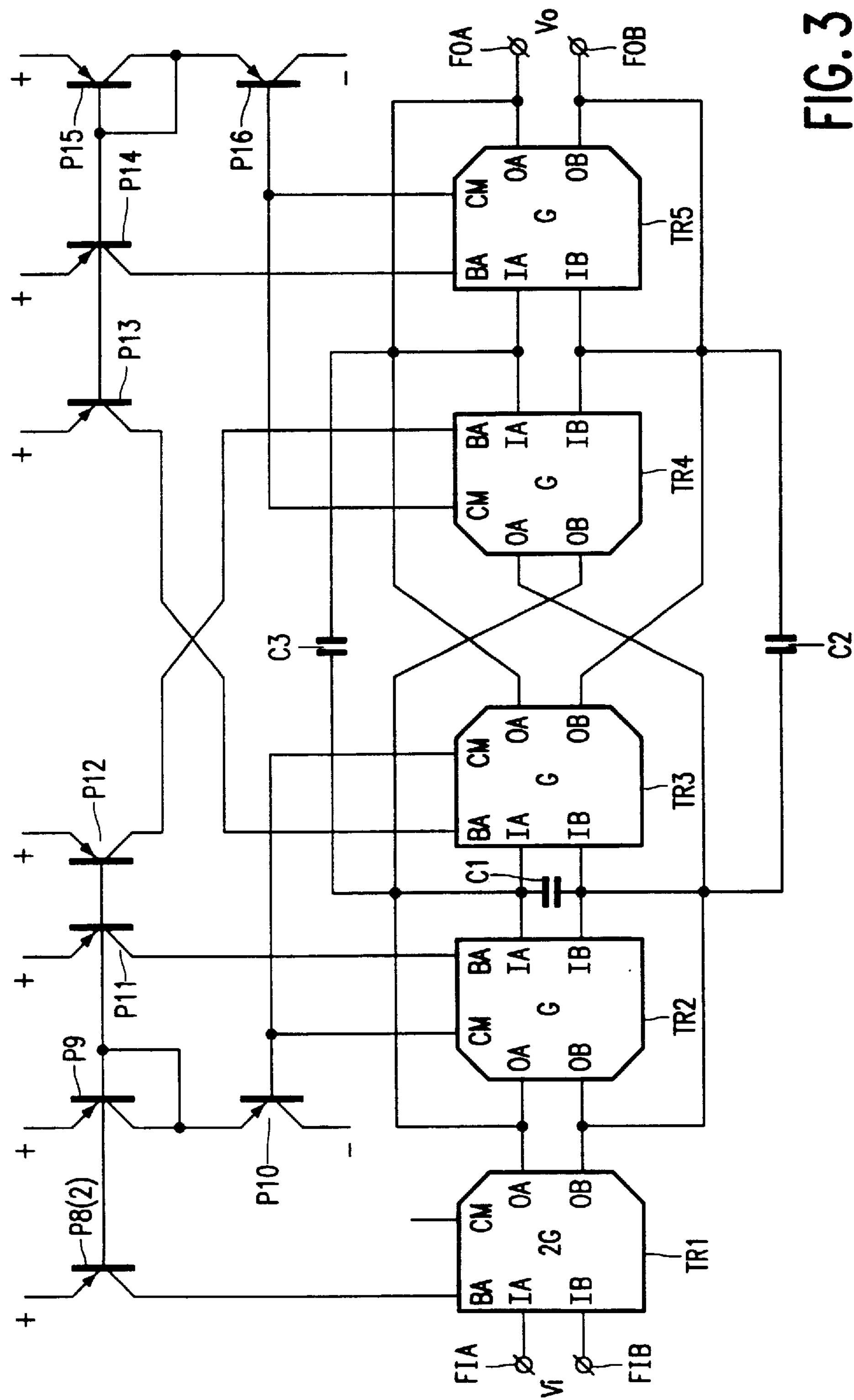
FIG. 3 shows a first transconductor-C filter including an embodiment of an electronic circuit with symbolically shown transconductors in accordance with the invention.

The technique described hereinbefore is very suitable for use in balanced transconductor-C filters, of which a first example is shown in FIG. 3. This Figure uses the same notation as FIG. 2. Again, the biasing of the respective nodes BA of the transconductors with the PNP current source transistors is shown explicitly. In the same way as in FIG. 2, the biasing of the respective nodes BB with the NPN current source transistors is not shown. FIG. 3 shows a first-order low-pass filter followed by a first-order all-pass filter. There are five transconductors TR1 . . . TR5, of which the transconductor TR1 has transconductance 2G and the other transconductors have a transconductance G. The input terminals IA and IB of the transconductor TR1 are connected to the filter input terminals FIA and FIB and the output terminals OA and OB of the transconductor TR5 are connected to the filter output terminals FOA and FOB. The output terminals OA and OB of the transconductor TR1 are connected to the output terminals OA and OB of the transconductor TR2; the input terminals IA and IB of the transconductor TR2 are connected to the input terminals IA and IB of the transconductor TR3; the input terminals IA and IB of the transconductor TR4 are connected to the input terminals IA and IB of the transconductor TR5. Moreover, the output terminals OA and OB and the input terminals IA and IB of the transconductor TR2 are connected to one another and the output terminals OA and OB and the input terminals IA and IB of the transconductor TR5 are connected to one another. The output terminals OA and OB of the transconductor TR3 are connected to the input terminals IA and IB of the transconductor TR4 and the output terminals OA and OB of the transconductor TR4 are connected the other way round to the input terminals IA and IB of the transconductor TR3. A capacitor C1 having a capacitance 2Ca is connected across the input terminals IA and IB of the transconductor TR2. A capacitor C3 having a capacitance 2Cb is connected between the input terminal IA of the transconductor TR3 and the input terminal IA of the transconductor TR4; a capacitor C2 also having a capacitance 2Cb is connected between the input terminal IB of the transconductor TR3 and the input terminal IB of the transconductor TR4. As a result of this, the configuration has a transfer function:

$$\frac{Vo}{Vi} = \frac{G}{G + p*Ca} \quad \frac{G - p*Cb}{G + p*Cb}$$

The common-mode terminals CM of the transconductors TR2 and TR3 are interconnected and function as a reference for the bias of the respective nodes BA of the transconductors TR1, TR2 and TR4 via the current source transistors P8, P11 and P12, which form a current mirror with the diode-connected transistor P9, which is connected to the common-mode terminals CM of the transconductors TR2 and TR3 via a transistor P10. The common-mode terminals CM of the transconductors TR4 and TR5 are connected to one another and function as a reference for the bias of the respective nodes BA of the transconductors TR3 and TR5 via the current source transistors P13 and P14, which form a current mirror with the diode-connected transistor P15, which is connected to the common-mode terminals CM of the transconductors TR4 and TR5 via a transistor P16. Interconnection of the common-mode terminals CM of the transconductors TR2 and TR3 and of the transconductors TR4 and TR5 is possible because the inputs of these transconductors are at the same voltage. The area of the current source transistor P8 is twice as large as that of the other current source transistors in order to supply the transconductor TR1 with a quiescent current which is twice as large, so that this transconductor is given a transconductance which is twice as high as that of the other transconductors.

Figure 4:
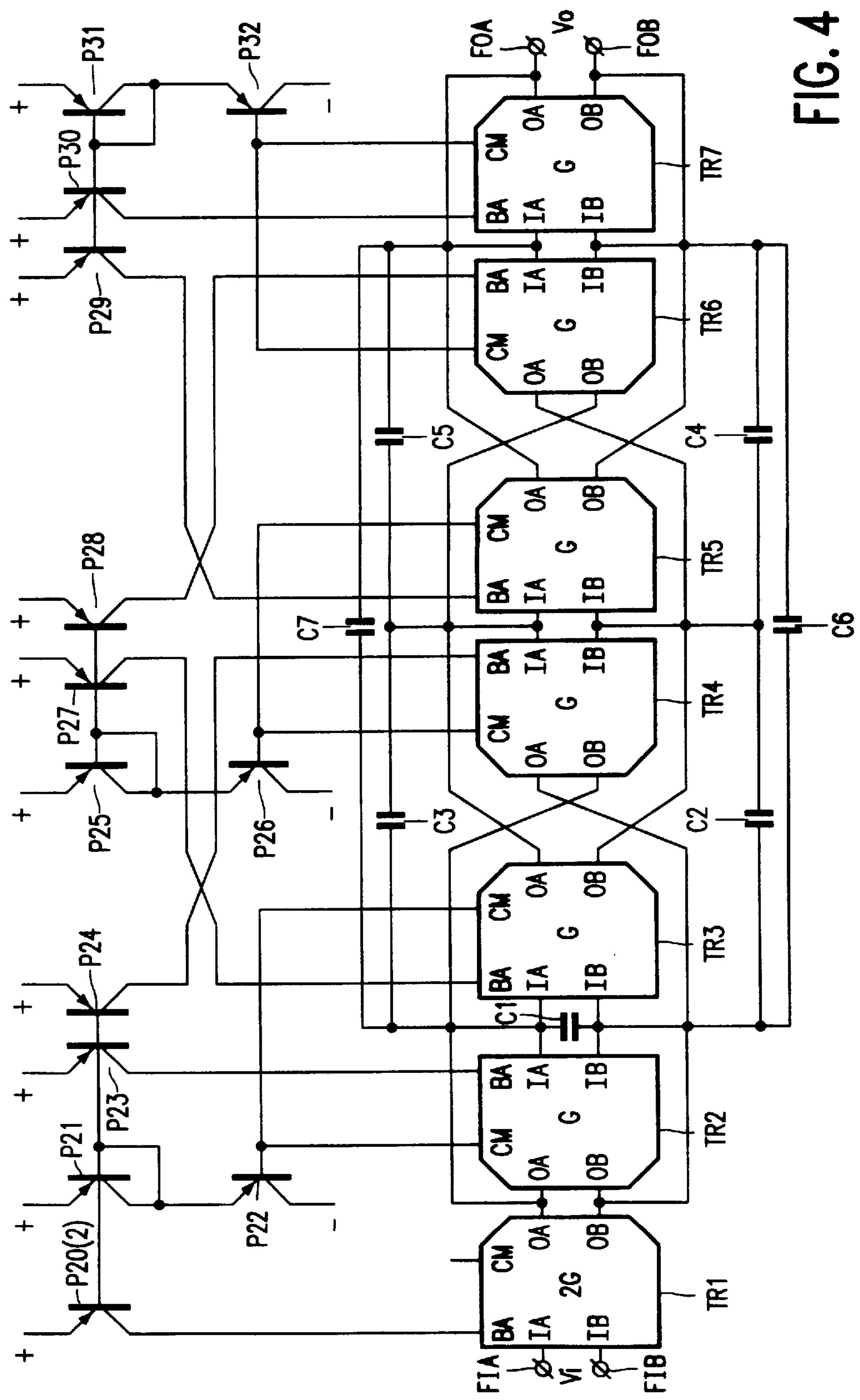
FIG. 4 shows a second transconductor-C filter including an embodiment of an electronic circuit with symbolically shown transconductors in accordance with the invention.

FIG. 4 shows a second example of an application in a transconductor-C filter. This concerns a combination of a first-order low-pass filter and a second-order all-pass filter. There are seven transconductors TR1 . . . TR7, of which the transconductor TR1 has transconductance 2G and the other transconductors have a transconductance G. The input terminals IA and IB of the transconductor TR1 are connected to the filter input terminals FIA and FIB and the output terminals OA and OB of the transconductor TR7 are connected to the filter output terminals FOA and FOB. The output terminals OA and OB of the transconductor TR1 are connected to the output terminals OA and OB of the transconductor TR2; the input terminals IA and IB of the transconductor TR2 are connected to the input terminals IA and IB of the transconductor TR3; the input terminals IA and IB of the transconductor TR4 are connected to the input terminals IA and IB of the transconductor TR5; the input terminals IA and IB of the transconductor TR6 are connected to the input terminals IA and IB of the transconductor TR7. Furthermore, the output terminals OA and OB and the input terminals IA and IB of the transconductor TR2 are connected to one another and the output terminals OA and OB and the input terminals IA and IB of the transconductor TR7 are connected to one another. The output terminals OA and OB of the transconductor TR3 are connected to the input terminals IA and IB of the transconductor TR4 and the output terminals OA and OB of the transconductor TR4 are connected the other way round to the input terminals IA and IB of the transconductor TR3; and the output terminals OA and OB of the transconductor TR5 are connected to the input terminals IA and IB of the transconductor TR6 and the output terminals OA and OB of the transconductor TR6 are connected the other way round to the input terminals IA and IB of the transconductor TR5. A capacitor C1 having a capacitance 2Cc is connected across the input terminals IA and IB of the transconductor TR2. A capacitor C3 having a capacitance 2Cd is connected between the input terminal IA of the transconductor TR3 and the input terminal IA of the transconductor TR4; a capacitor C2 also having a capacitance 2Cd is connected between the input terminal IB of the transconductor TR3 and the input terminal IB of the transconductor TR4; a capacitor C5 having a capacitance 2Ce is connected between the input terminal IA of the transconductor TR5 and the input terminal IA of the transconductor TR6; a capacitor C4 also having a capacitance 2Ce is connected between the input terminal IB of the transconductor TR5 and the input terminal IB of the transconductor TR6; a capacitor C7 having a capacitance 2Cf is connected between the input terminal IA of the transconductor TR3 and the input terminal IA of the transconductor TR6; and a capacitor C6 also having a capacitance 2Cf is connected between the input terminal IB of the transconductor TR3 and the input terminal IB of the transconductor TR6. As a result of this, the configuration has a transfer function:

$$\frac{Vo}{Vi} = \frac{G}{G + p*Cc} \quad \frac{G*G - p(Cd + Ce)G + p*p(Cd*Ce + Ce*Cf + Cf*Cd)}{G*G + p(Cd + Ce)G + p*p(Cd*Ce + Ce*Cf + Cf*Cd)}$$

The common-mode terminals CM of the transconductors TR2 and TR3 are interconnected and function as a reference for the bias of the respective nodes BA of the transconductors TR1, TR2 and TR4 via the current source transistors P20, P23 and P24, which form a current mirror with the diode-connected transistor P21, which is connected to the common-mode terminals CM of the transconductors TR2 and TR3 via a transistor P22. The common-mode terminals CM of the transconductors TR4 and TR5 are connected to one another and function as a reference for the bias of the respective nodes BA of the transconductors TR3 and TR6 via the current source transistors P27 and P28, which form a current mirror with the diode-connected transistor P25, which is connected to the common-mode terminals CM of the transconductors TR4 and TR5 via a transistor P26. The common-mode terminals CM of the transconductors TR6 and TR7 are connected to one another and function as a reference for the bias of the respective nodes BA of the transconductors TR5 and TR7 via the current source transistors P29 and P30, which form a current mirror with the diode-connected transistor P31, which is connected to the common-mode terminals CM of the transconductors TR6 and TR7 via a transistor P32. Interconnection of the common-mode terminals CM of the transconductors TR2 and TR3, of the transconductors TR4 and TR5, and of the transconductors TR6 and TR7 is possible because the inputs of these transconductors are at the same voltage. The area of the current source transistor P20 is twice as large as that of the other current source transistors in order to supply the transconductor TR1 with a quiescent current which is twice as large, so that this transconductor is given a transconductance which is twice as high as that of the other transconductors.

Figure 5:
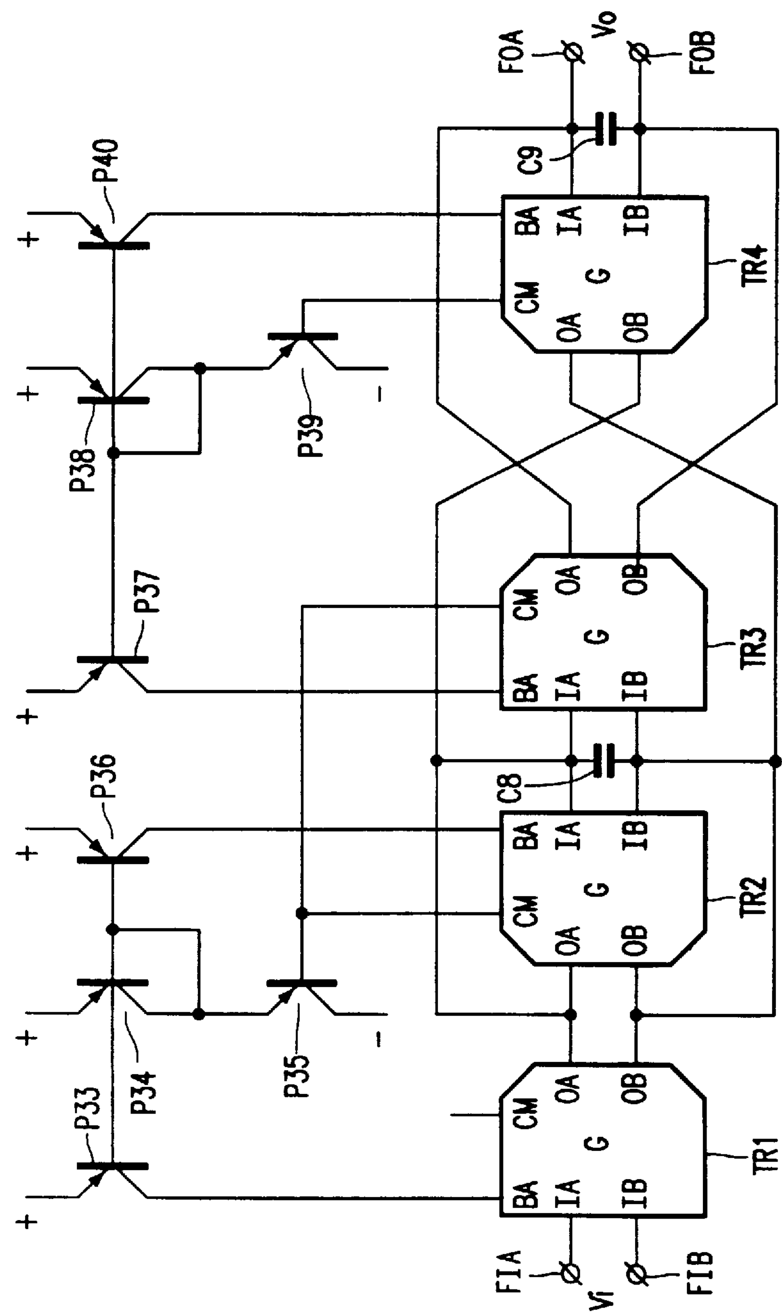
FIG. 5 shows a third transconductor-C filter including an embodiment of an electronic circuit with symbolically shown transconductors in accordance with the invention.

FIG. 5 shows a second-order low-pass filter. There are four transconductors TR1..TR4, all having a transconductance G. The input terminals IA and IB of the transconductor TR1 are connected to the filter input terminals FIA and FIB and the input terminals IA and IB of the transconductor TR4 are connected to the filter output terminals FOA and FOB. The output terminals OA and OB of the transconductor TR1 are connected to the output terminals OA and OB of the transconductor TR2; the input terminals IA and IB of the transconductor TR2 are connected to the input terminals IA and IB of the transconductor TR3; the input terminals IA and IB of the transconductor TR4 are connected to the output terminals OA and OB of the transconductor TR3. Moreover, the output terminals OA and OB and the input terminals IA and IB of the transconductor TR2 are connected to one another. The output terminals OA and OB of the transconductor TR4 are connected the other way round to the input terminals IA and IB of the transconductor TR3. A capacitor C8 having a capacitance Cg is connected across the input terminals IA and IB of the transconductor TR2; and a capacitor C9 having a capacitance Ch is connected across the input terminals IA and IB of the transconductor TR4. As a result of this, the configuration has a transfer function:

$$\frac{Vo}{Vi} = \frac{G*G}{G*G + p*Ch*G + p*p*Cg*Ch}$$

The common-mode terminals CM of the transconductors TR2 and TR3 are interconnected and function as a reference for the bias of the respective nodes BA of the transconductors TR1 and TR2 via the current source transistors P33 and P36, which form a current mirror with the diode-connected transistor P34, which is connected to the common-mode terminals CM of the transconductors TR2 and TR3 via a transistor P35. The common-mode terminal CM of the transconductor TR4 functions as a reference for the bias of the respective nodes BA of the transconductors TR3 and TR4 via the current source transistors P37 and P40, which form a current mirror with the diode-connected transistor P38, which is connected to the common-mode terminal CM of the transconductor TR4 via a transistor P39. Interconnection of the common-mode terminals CM of the transconductors TR2 and TR3 is possible because the inputs of these transconductors are at the same voltage.

Figure 6:
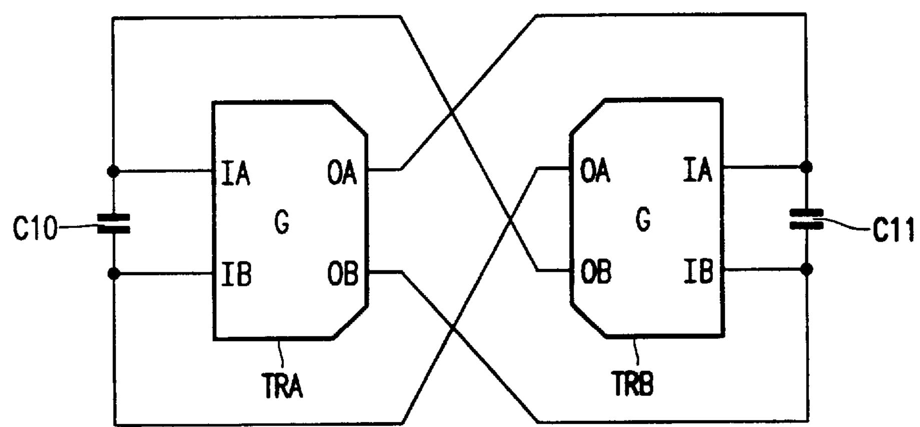
FIG. 6 shows the basic circuit diagram of an oscillator with two transconductors and two capacitors.

The described technique can also be used in other circuits comprising transconductors. FIG. 6 shows an oscillator with two transconductors TRA and TRB, which are again of the type as shown in FIG. 1. The output terminals OA and OB of the transconductor TRA are connected to the input terminals IA and IB of the transconductor TRB and the output terminals OA and OB of the transconductor TRB are connected the other way round to the input terminals IA and IB of the transconductor TRA. Furthermore, a capacitor C10 is connected across the input terminals IA and IB of the transconductor TRA and a capacitor C11 is connected across the input terminals IA and IB of the transconductor TRB. The oscillation frequency is equal to G/Co, Co being the capacitance of the capacitors C10 and C11.

Figure 7:
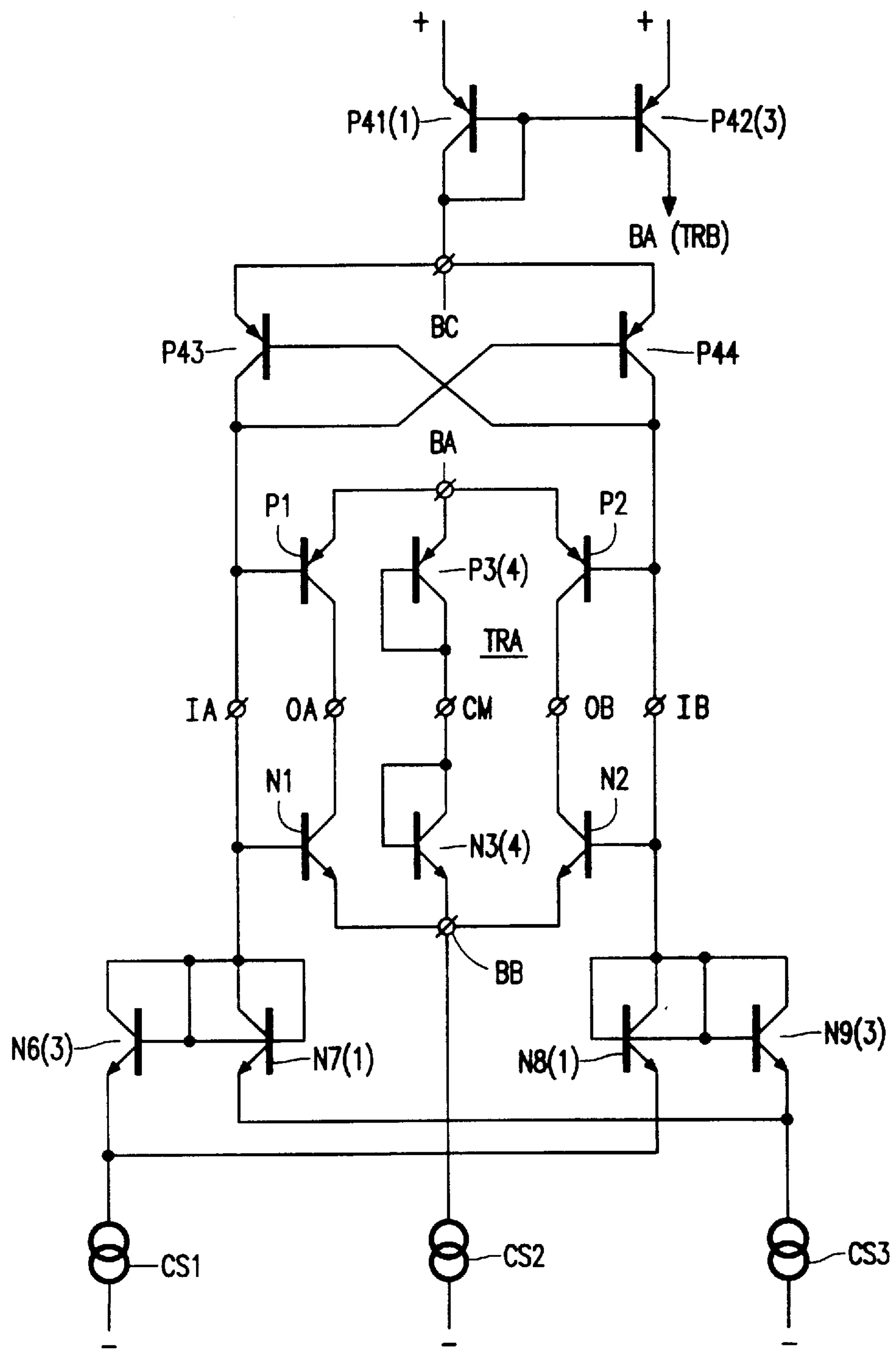
FIG. 7 shows a part of a embodiment of an electronic circuit with transconductors in accordance with the invention for use in the oscillator shown in FIG. 6.

FIG. 7 shows the transconductor TRA of FIG. 6. A PNP transistor P43 has its emitter, collector and base connected to a further node BC, the input terminal IA and the input terminal IB, respectively. A PNP transistor P43 has its emitter, collector and base connected to the node BC, the input terminal IB and the input terminal IA, respectively. The node BC is connected to the positive supply terminal via a diode-connected PNP transistor P41. The transistor P41 forms a current mirror with a PNP transistor P42, whose collector is connected to the node BA of the other transconductor TRB, which is identical to the transconductor TRA and which is not shown in FIG. 7. The transconductor TRB consequently also comprises a transistor similar to the transistor P42, whose collector is connected to the node BA of the transconductor TRA. The emitter area of the transistor P42 is, for example, 3 times as large as that of the transistor P41. The input terminal IA is coupled to a current source CS1 via a diode-connected NPN transistor N6 and the input terminal IB is coupled to this current source via a diode-connected transistor N8. The ratio between the emitter areas of the transistors N6 and N8 is, for example, 3:1. Furthermore, the input terminal IA is coupled to a current source CS3 via a diode-connected NPN transistor N7 and the input terminal IB is coupled to this current source via a diode-connected transistor N9. The ratio between the emitter areas of the transistors N7 and N9 is, for example, 1:3. The node BB is coupled to a current source CS2, which supplies a bias current which is, for example, twice as large as that of the current sources CS1 and CS3. The transistors P43 and P44 provide attenuation equalization for small signals, so that the oscillator starts correctly. The transistors N6, N7, N8 and N9 and the current sources CS1 and CS2 together form a transconductor arranged as a resistor to provide attenuation for large signals, in order to limit the amplitude of such signals.

In the present case the common-mode voltage is not measured on the terminal CM but on the further node BC. The transistors P43 and P44 now perform a double function, i.e. they provide attenuation equalization and they buffer a common-mode voltage. In this way, no extra current is required in order to achieve attenuation equalization.

We claim:

1. An electronic circuit comprising a plurality of at least a first transconductor (TR1) and a second transconductor (TR2), each having first (IA) and second (IB) input terminals for receiving a differential voltage and having first (OA) and second (OB) output terminals for supplying a differential current in response to the differential voltage, characterized in that each transconductor of the at least first transconductor (TR1) and second transconductor (TR2) comprises:

- a first differential pair (P1, P2) of transistors of a first conductivity type, having their respective first main electrodes coupled to one another in a first node (BA), having their respective second main electrodes coupled to the first output terminal (OA) and the second output terminal (OB), and having their respective control electrodes coupled to the first input terminal (IA) and the second input terminal (IB);
- a second differential pair (N1, N2) of transistors of a second conductivity type opposite to the first conductivity type of the first differential pair (P1, P2), the second differential pair having their respective first main electrodes coupled to one another in a second node (BB), having their respective second main electrodes coupled to the first output terminal (OA) and the second output terminal (OB), and having their respective control electrodes coupled to the first input terminal (IA) and the second input terminal (IB);
- a first current source (P4) coupled to the first node (BA) to supply a first bias current to the first differential pair (P1, P2);
- a second current source (N4) coupled to the second node (BB) to supply a second bias current to the second differential pair (N1, N2);

a first diode-connected transistor (P3) of the first conductivity type and a second diode-connected transistor (N3) of the second conductivity type, which are connected in series between the first node (BA) and the second node (BB);

and the electronic circuit further comprises:

means (P6, P7) for controlling the first current source (P4) of at least the first transconductor (TR1) in response to a common-mode voltage of the second transconductor (TR2).

2. An electronic circuit as claimed in claim 1, characterized in that the means for controlling comprise:

a current mirror (P4, P5) having an input branch (P5) coupled to the first node (BA) of the second transconductor (TR2), and having output branches (P4) coupled to respective first nodes (BA) of at least the first transconductor (TR1).

3. An electronic circuit as claimed in claim 1, characterized in that the input branch of the current mirror comprises:

a measurement transistor (P6) of the first conductivity type having a control electrode connected to a node (CM) between the first diode-connected transistor (P3) and the second diode-connected transistor (N3) of the second transconductor (TR2);

a further diode-connected transistor (P7) of the first conductivity type arranged in series with the first main electrode of the measurement transistor (P6); and a still further transistor (P5) of the first conductivity type having a control electrode and a first main electrode arranged in parallel with corresponding electrodes of the further diode-connected transistor (P7) and having a second main electrode coupled to the first node (BA) of the second transconductor (TR2).

4. An electronic circuit as claimed in claim 2, characterized in that respective nodes (CM) of the first diode-connected transistor (P3) and the second diode-connected transistor (N3) of a number of transistors of the plurality of transconductors are connected to one another.

5. An electronic circuit as claimed in claim 1, characterized in that the first (TRA) and the second (TRB) transconductor each further comprise:

a further differential pair (P43, P44) of transistors of the first conductivity type, having respective first main electrodes coupled to one another in a further node (BC), having respective second main electrodes coupled to the first input terminal (IA) and the second input terminal (IB), and having respective control electrodes coupled to the second input terminal (IB) and the first input terminal (IA); and a current mirror (P41, P42) having an input branch (P41) coupled to the further node (BC) of the first transconductor (TRA) and having an output branch (P42) coupled to the first node (BA) of the second transconductor (TRB).

6. An electronic circuit as claimed in claim 5, characterized in that the first (TRA) and the second (TRB) transconductor each further comprise:

a third current source (CS1) for supplying a third bias current;

a third diode-connected transistor (N6) of the second conductivity type, connected between the first input terminal (IA) and the third current source (CS1);

a fourth diode-connected transistor (N8) of the second conductivity type, connected between the second input terminal (IB) and the third current source (CS1);

a fourth current source (CS3) for supplying a fourth bias current;

a fifth diode-connected transistor (N7) of the second conductivity type, connected between the first input terminal (IA) and the fourth current source (CS3); and a sixth diode-connected transistor (N9) of the second conductivity type, connected between the second input terminal (IB) and the fourth current source (CS3).

7. An electronic circuit as claimed in claim 1, characterized in that the dimensions of the first (P3) and the second (N3) diode-connected transistor are four times as large as those of the transistors of the first (P1, P2) and the second (N1, N2) differential pair.

8. An electronic circuit as claimed in claim 3, characterized in that respective nodes (CM) of the first diode-connected transistor (P3) and the second diode-connected transistor (N3) of a number of transistors of the plurality of transconductors are connected to one another.

9. An electronic circuit as claimed in claim 2, characterized in that the dimensions of the first (P3) and the second (N3) diode-connected transistor are four times as large as those of the transistors of the first (P1, P2) and the second (N1, N2) differential pair.

10. An electronic circuit as claimed in claim 3, characterized in that the dimensions of the first (P3) and the second (N3) diode-connected transistor are four times as large as those of the transistors of the first (P1, P2) and the second (N1, N2) differential pair.

11. An electronic circuit as claimed in claim 4, characterized in that the dimensions of the first (P3) and the second (N3) diode-connected transistor are four times as large as those of the transistors of the first (P1, P2) and the second (N1, N2) differential pair.

12. An electronic circuit as claimed in claim 5, characterized in that the dimensions of the first (P3) and the second (N3) diode-connected transistor are four times as large as those of the transistors of the first (P1, P2) and the second (N1, N2) differential pair.

13. An electronic circuit as claimed in claim 6, characterized in that the dimensions of the first (P3) and the second (N3) diode-connected transistor are four times as large as those of the transistors of the first (P1, P2) and the second (N1, N2) differential pair.

* * * * *